US010768502B2

(12) United States Patent
Han

(10) Patent No.: US 10,768,502 B2
(45) Date of Patent: Sep. 8, 2020

(54) SYNAPTIC ELECTRONIC DEVICES WITH ELECTROCHROMIC DEVICE

(71) Applicant: International Business Machines Corporation, Armonk, NY (US)

(72) Inventor: Shu-Jen Han, Cortlandt Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 81 days.

(21) Appl. No.: 16/126,213

(22) Filed: Sep. 10, 2018

(65) Prior Publication Data

US 2019/0004385 A1 Jan. 3, 2019

Related U.S. Application Data

(62) Division of application No. 14/744,764, filed on Jun. 19, 2015, now Pat. No. 10,139,693.

(51) Int. Cl.
*G02F 1/157* (2006.01)
*G02F 1/1523* (2019.01)
(Continued)

(52) U.S. Cl.
CPC ............ *G02F 1/157* (2013.01); *G02F 1/155* (2013.01); *G02F 1/1508* (2013.01); *G02F 1/1525* (2013.01); *G02F 1/1533* (2013.01); *G02F 1/163* (2013.01); *G06N 3/0675* (2013.01); *H01L 27/142* (2013.01); *H01L 31/02162* (2013.01); *H01L 31/02327* (2013.01); *H01L 31/09* (2013.01); *H01L 31/102* (2013.01); *H01L 31/18* (2013.01); *H01L 31/184* (2013.01); *H01L 31/1804* (2013.01); *H01L 31/1808* (2013.01); (Continued)

(58) Field of Classification Search
CPC ............ G02F 1/15–163; G06N 3/0675; H01L 27/142; H01L 31/02162; H01L 31/02327; H01L 31/09; H01L 31/102; H01L 31/18; H01L 31/1804; H01L 31/1808; H01L 31/1828; H01L 31/184; H01L 31/1844
See application file for complete search history.

(56) References Cited

U.S. PATENT DOCUMENTS

| 4,931,763 A | 6/1990 | Ramesham et al. |
| 5,204,937 A | 4/1993 | Minnaja |

(Continued)

OTHER PUBLICATIONS

List of IBM Patents or Patent Applications Treated as Related; (Appendix P), Filed Sep. 13, 2018; 2 pages.

(Continued)

*Primary Examiner* — Cara E Rakowski
(74) *Attorney, Agent, or Firm* — Cantor Colburn LLP; Vazken Alexanian

(57) ABSTRACT

A synaptic electronic device includes a substrate including a one or more of a semiconductor and an insulator; a photosensitive layer disposed on a surface of the substrate; an electrochromic stack disposed on the photosensitive layer, the electrochromic stack including a first transparent electrode layer, a cathodic electrochromic layer, a solid electrolyte layer, an anodic electrochromic layer, and a second transparent electrode layer; and a pair of electrodes disposed on the photosensitive layer and on opposing sides of the electrochromic stack.

18 Claims, 7 Drawing Sheets

(51) Int. Cl.
  G02F 1/155      (2006.01)
  G02F 1/163      (2006.01)
  H01L 31/18      (2006.01)
  H01L 31/09      (2006.01)
  H01L 31/102     (2006.01)
  H01L 31/0232    (2014.01)
  G06N 3/067      (2006.01)
  H01L 31/0216    (2014.01)
  H01L 27/142     (2014.01)
  G02F 1/15       (2019.01)
  G02F 1/153      (2006.01)

(52) U.S. Cl.
  CPC ...... *H01L 31/1828* (2013.01); *H01L 31/1844* (2013.01)

(56) References Cited

U.S. PATENT DOCUMENTS

| | | | |
|---|---|---|---|
| 5,428,711 A | 6/1995 | Akiyama et al. | |
| 5,864,836 A | 6/1999 | Balsi et al. | |
| 6,277,523 B1 | 8/2001 | Giron | |
| 6,548,316 B1 | 4/2003 | Tam et al. | |
| 7,359,888 B2 | 4/2008 | Snider | |
| 2004/0229049 A1* | 11/2004 | Boire | B32B 17/10036 |
| | | | 428/432 |
| 2007/0115399 A1* | 5/2007 | Brabec | G02F 1/163 |
| | | | 349/42 |
| 2009/0008531 A1 | 1/2009 | Caubet et al. | |
| 2009/0097097 A1 | 4/2009 | Desmond et al. | |
| 2010/0317132 A1* | 12/2010 | Rogers | H01L 33/486 |
| | | | 438/27 |
| 2011/0292487 A1* | 12/2011 | Noh | G02F 1/15 |
| | | | 359/265 |
| 2013/0247971 A1* | 9/2013 | Haas | H01L 31/02168 |
| | | | 136/256 |
| 2013/0273315 A1 | 10/2013 | Mansky | |
| 2015/0117128 A1 | 4/2015 | Caubet et al. | |
| 2016/0370681 A1 | 12/2016 | Han | |
| 2016/0370682 A1 | 12/2016 | Han | |

OTHER PUBLICATIONS

Agnus, Guillaume, et al; "Two-Terminal Carbon Nanotube Programmable Devices for Adaptive Architectures"; Adv. Mater.; vol. 22; p. 702-706; 2010.

Ahn, Kwang-Soon, et al.; "Thickness-Dependent Microstructural and Electrochromic Properties of Sputter-Deposited Ni Oxide Films"; J. Vac. Sci. Technol. A; vol. 20, No. 4; p. 1468-1474; Jul./Aug. 2002.

Chu, Chien-Hsun, et al.; "Novel WO3-Based Electrochromic Device for High Optical Modulation and Infrared Suppression"; IEEE Electron Device Letters; vol. 36, No. 3; p. 256-258; Mar. 3, 2015.

Kuzum, Duygu, et al.; "Synaptic Electrochromics; Materials, Devices and Applications"; Nanotechnology; vol. 24; p. 1-22; 2013.

Patel, K.J., et al.; All-Solid-Thin Film Electrochromic Devices Consisting of Layers ITO/ NiO / ZrO2 / WO3 / ITO; Journal of Nano- and Electronic Physics; vol. 5,No. 2; p. 02023-1-02023-3; 2013.

* cited by examiner

SYNAPTIC ELECTRONIC DEVICES WITH ELECTROCHROMIC DEVICE

PRIORITY

This application is a division of and claims priority from U.S. patent application Ser. No. 14/744,764, filed on Jun. 19, 2015, the entire contents of which are incorporated herein by reference.

BACKGROUND

The present invention generally relates to synaptic electronic devices, and more specifically, to electronic devices with electrochromic stacks.

Physical scaling limits and the relatively low efficiency of the current computing architecture (Von Neumann architecture) limits current semiconductor technology. Accordingly, alternative structures and architectures, for example, neuromorphic systems, have become attractive areas of research.

Neuromorphic systems are brain-inspired systems that model neurons and synapses. Neuromorphic engineering/computing uses very-large-scale integration (VLSI) systems containing electronic analog circuits to mimic neuro-biological architectures present in the nervous system. One aspect of neuromorphic engineering is to understand how neuron morphology and overall architectures creates desirable computations.

Neuromorphic computing systems utilize various technologies. Silicon complementary metal oxide semiconductor (CMOS) technology is one example. Nanoscale phase-change memory (PCM) or resistive random access memory (RRAM) technologies also are used to implement biological synapses.

SUMMARY

In one embodiment of the present invention, a synaptic electronic device includes a substrate including a one or more of a semiconductor and an insulator; a photosensitive layer disposed on a surface of the substrate; an electrochromic stack disposed on the photosensitive layer, the electrochromic stack including a first transparent electrode layer, a cathodic electrochromic layer, a solid electrolyte layer, an anodic electrochromic layer, and a second transparent electrode layer; and a pair of electrodes disposed on the photosensitive layer and on opposing sides of the electrochromic stack.

In another embodiment, a synaptic electronic device includes a substrate including one or more of a semiconductor and an insulator; an electrochromic stack disposed on a surface of the substrate, the electrochromic stack includes a first transparent electrode layer, a cathodic electrochromic layer, a solid electrolyte layer, an anodic electrochromic layer, and a second transparent electrode layer; a photosensitive layer disposed on the electrochromic stack; and a pair of electrodes disposed on and at opposing end of the photosensitive layer.

Yet, in another embodiment, a synaptic electronic device includes a substrate including one or more of a semiconductor and an insulator; an electrochromic stack disposed on a surface of the substrate, the electrochromic stack includes a first transparent electrode layer, a cathodic electrochromic layer, a solid electrolyte layer, an anodic electrochromic layer, and a second transparent electrode layer; a photosensitive layer disposed on the electrochromic stack; and a pair of electrodes disposed on and at opposing end of the photosensitive layer.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1A-1D illustrate a first embodiment of a sensor first electronic device, in which:

FIG. 1A illustrates a cross-sectional side view of a photosensitive layer over a substrate;

FIG. 1B illustrates a cross-sectional side view of a pair of electrodes formed over the photosensitive layer;

FIG. 1C illustrates a cross-sectional side view of an electrochromic stack formed between the electrodes;

FIG. 1D illustrates light activation of the device in FIG. 1C;

FIGS. 2A-2F illustrate a second embodiment of a sensor last electronic device, in which:

FIG. 2A illustrates a cross-sectional side view of a substrate;

FIG. 2B illustrates a cross-sectional side view of an electrochromic stack formed over the substrate;

FIG. 2C illustrates a cross-sectional side view of a photosensitive layer formed over the electrochromic stack;

FIG. 2D illustrates a cross-sectional side view of a pair of electrodes formed over the electrochromic stack;

FIG. 2E illustrates a cross-sectional side view of an optional passivation layer formed on the photosensitive layer;

FIG. 2F illustrates a cross-sectional side view of light activation of the device in FIG. 2E.

DETAILED DESCRIPTION

Figure 1B:
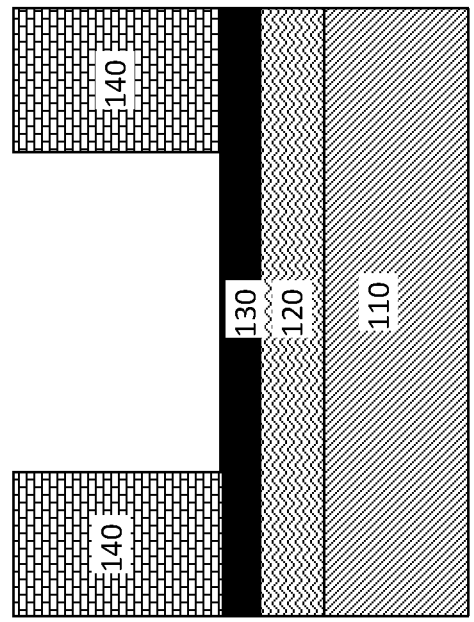

Multi-level storage capability of PCM and RRAM devices is a challenge. Such devices may also suffer from high power consumption. Therefore, it is desirable to develop new electronic synaptic devices that have wide operation windows for multilevel operation, as well as low power requirements.

Accordingly, the present invention provides electronic devices with electrochromic stacks and photosensitive layers (e.g., photoresistors and photodiodes) that consume relatively low power and have wide operation windows for multilevel operation. The electronic devices are now described in detail with accompanying figures. It is noted that like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

As used herein, the term "electrochromic" refers to the property of changing light transmission properties in response to voltage.

Figure 1A:
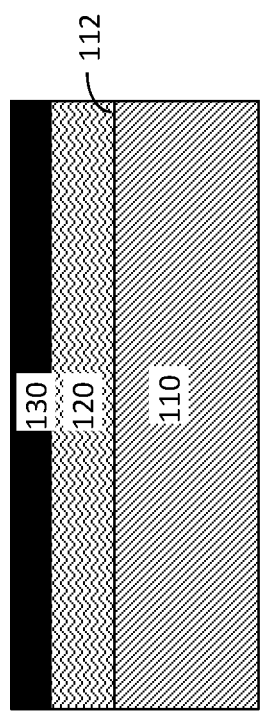

Turning now to the Figures, FIGS. 1A-1D illustrate a first embodiment of a sensor first synaptic electronic device. FIG. 1A illustrates a cross-sectional side view of a photosensitive layer 130 over a substrate 110. The substrate 110 has a surface 112. The substrate includes a semiconducting material or an insulating material. Non-limiting examples of materials for the substrate 110 include silicon, glass, GaAs, GaN, or any combination thereof. The substrate has a surface 110, and the photosensitive material 130 is formed over the surface of the substrate 110. When the substrate 110 includes silicon, the substrate 110 may include a silicon oxide layer 120 (native oxide layer) between the photosensitive layer 130 and the substrate 110.

The thickness of the substrate 110 is not intended to be limited. In one aspect, the thickness of the substrate 110 is in a range from about 10 micrometers (m) to about 10 millimeters (mm). In another aspect, the thickness of the substrate 110 is in a range from about 100 μm to about 500 μm.

The photosensitive layer 130 is formed over the substrate 110 by chemical vapor deposition, physical vapor deposition, or epitaxial growth. The photosensitive layer 130 includes a photoresistor or a photodiode. Non-limiting examples of suitable materials for the photosensitive layer 130 include silicon, germanium, cadmium sulfide, cadmium selenide, lead sulfide, indium antimonide, indium gallium arsenide, mercury cadmium telluride, or any combination thereof.

The thickness of the photosensitive layer 130 is not intended to be limited. In one aspect, the thickness of the photosensitive layer 130 is in a range from about 10 nm to about 100 μm. In another aspect, the thickness of the photosensitive layer 130 is in a range from about 100 nm to about 10 μm. Yet, in another aspect, the thickness of the photosensitive layer 130 is about or in any range from about 100 nm, 200 nm, 300 nm, 400 nm, 500 nm, 600 nm, 700 nm, 800 nm, 900 nm, 1 μm, 3 μm, 5 μm, 8 μm, and 10 μm.

FIG. 1B illustrates a cross-sectional side view of a pair of electrodes 140 (source and drain) formed over the photosensitive layer 130. The pair of electrodes 140 may include, for example, molybdenum, titanium, indium tin oxide (ITO), indium zinc oxide (IZO), aluminum, gold, silver, palladium, silicon, boron, phosphorus, arsenic, gallium, or any combination thereof. The pair of electrodes 140 can be formed by lithography and etching techniques known in the art. The pair of electrodes 140 may have any suitable dimensions, depending on the size of the device.

Figure 1D:
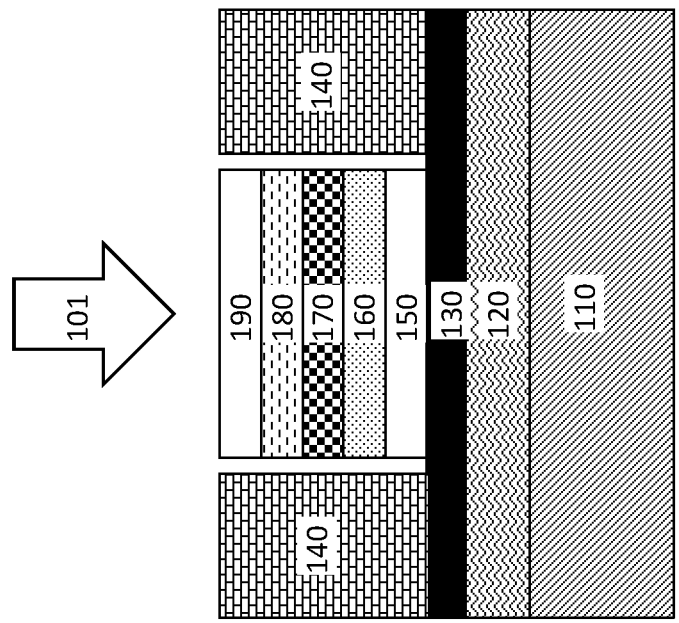
Figure 1C:
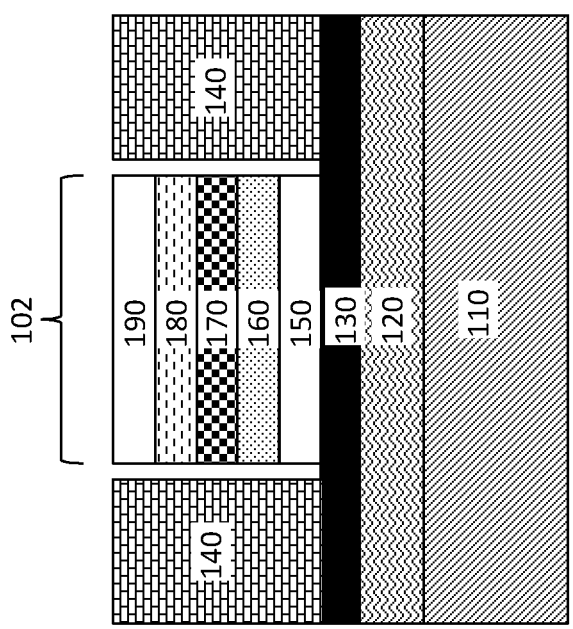

FIG. 1C illustrates a cross-sectional side view of an electrochromic stack 102 formed between the pair of electrodes 140. The pair of electrodes 140 are on opposing sides of the the electrochromic stack 102. The electrochromic stack 102 includes a first transparent electrode layer 150, a cathodic electrochromic layer 160, a solid electrolyte layer 170, an anodic electrochromic layer 180, and a second transparent electrode layer 190. The first transparent electrode 150 is formed on the photosensitive layer 130, the cathodic electrochromic layer 160 is formed on the first transparent electrode layer 150, the solid electrolyte layer 170 is formed on the cathodic electrochromic layer 160, the anodic electrochromic layer 180 is formed on the solid electrolyte layer, and the second transparent electrode layer 190 is formed on the anodic electrochromic layer 180.

Non-limiting examples of suitable materials for the first and second transparent electrode layers 150 and 190 include indium tin oxide, graphene, or any combination thereof. Non-limiting examples of suitable materials for the cathodic electrochromic layer 160 include tungsten oxide ($WO_3$), poly(3,4-ethylenedioxythiophene) polystyrene sulfonate (PEDOT:PSS), polycyclic aromatic hydrocarbon (PAH), graphene, or any combination thereof. The solid electrolyte layer 170 can include any proton conducting solid electrolyte material. A non-limiting example of a suitable material for the solid electrolyte layer 170 is zirconium oxide ($ZrO_2$). The anodic electrochromic layer 180 can be an ion storage material. A non-limiting example of suitable material for the anodic electrochromic layer 180 is nickel oxide (NiO).

Solid electrolyte layer 170 and anodic electrochromic layer 180 are optional and enhance the electrochromic effect. In one embodiment, an electrochromic includes a first transparent electrode layer 150, a cathodic electrochromic layer 160, and a second transparent electrode layer 190.

Although FIGS. 1C and 1D illustrate the pair of electrodes 140 as being formed before the electrochromic stack 102, the electrochromic stack 102 may be formed over the photosensitive layer 130 before the pair of electrodes 140 in some embodiments.

The layers in the electrochromic stack 102 may be formed, for example, by physical vapor deposition (PVD) or other methods known in the art. Any of the layers in the electrochromic stack 102 (the first and second transparent electrode layers 150 and 190, the cathodic electrochromic layer 160, the solid electrolyte layer 170, or the anodic electrochromic layer 180) can have a thickness in a range from about 10 nm to about 500 μm. In another aspect, the thickness of the individual layers in the electrochromic stack 102 is in a range from about 100 nm to about 10 μm. Yet, in another aspect, the thickness of the layers in the electrochromic stack 102 is about or in any range from about 10 nm, 100 nm, 500 nm, 1 μm, 50 μm, 100 μm, 200 μm, 300 μm, 400 μm, and 500 μm.

Figure 3A:
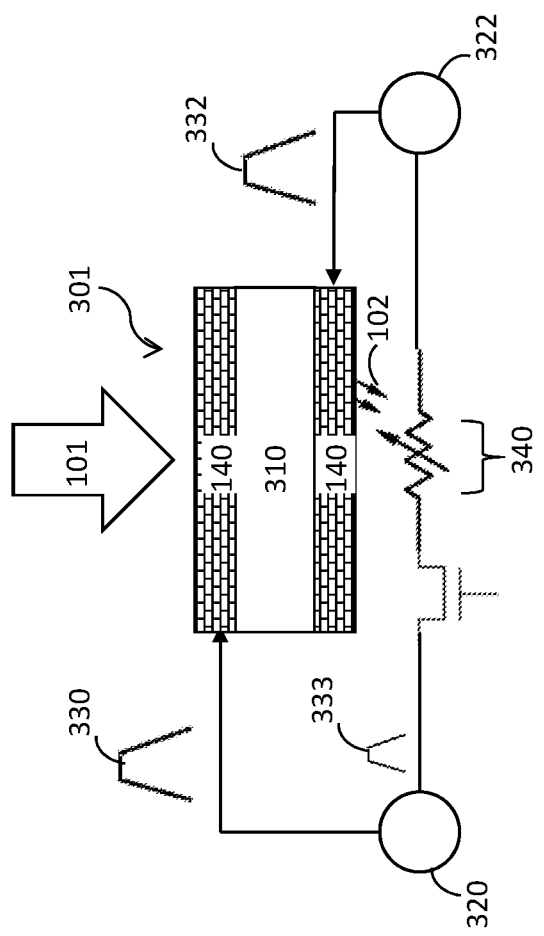
FIG. 3A illustrates a schematic diagram for operating an electronic device with an electrochromic stack and a photoresistor as the photosensitive layer.
Figure 3B:
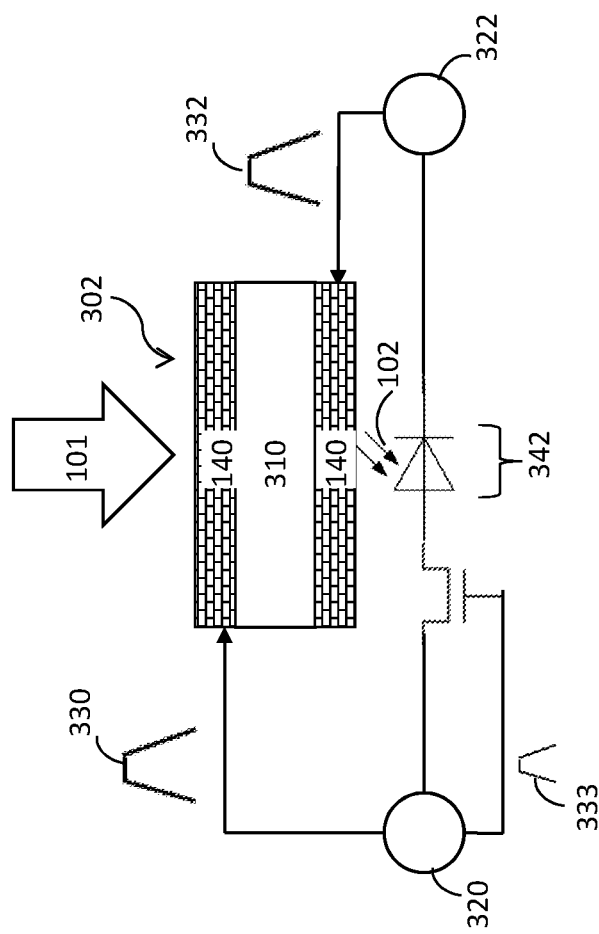
FIG. 3B illustrates a schematic diagram for operating an electronic device with an electrochromic stack and a photodiode as the photosensitive layer.

FIG. 1D illustrates light 101 activation of the device in FIG. 1C (see also FIGS. 3A and 3B). The electrochromic stack 102 serves as a visible light filter. When a voltage is applied, and under exposure to visible light 101, the cathodic electrochromic layer 160 and the anodic electrochromic layer 180 in the electrochromic stack 102 switch between bleached (colorless) states and colored states. For example, when the cathodic electrochromic layer 160 is WO₃, and the anodic electrochromic layer 180 is NiO, the following redox reactions occur in the cathodic electrochromic layer 160 and the anodic electrochromic layer 180:

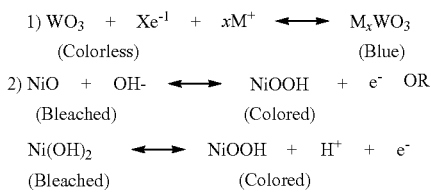

Both the cathodic electrochromic layer 160 and the anodic electrochromic layer 180 are colored and bleached simultaneously, which increases optical modulation. Under a voltage bias, optical properties of the device are altered. In particular, the transmittance changes between "1" and "0" by electrically controlled electrochemical redox reactions in the electrochromic stack 102.

The electrochromic stack 102 serves as a visible light 101 filter. The applied voltage determines how much light 101 passes through the electrochromic stack 102. When the photosensitive layer 130 is a photoresistor, the photosensitive layer 103 changes resistance based on how much light passes through the electrochromic stack 102.

Figure 2B:
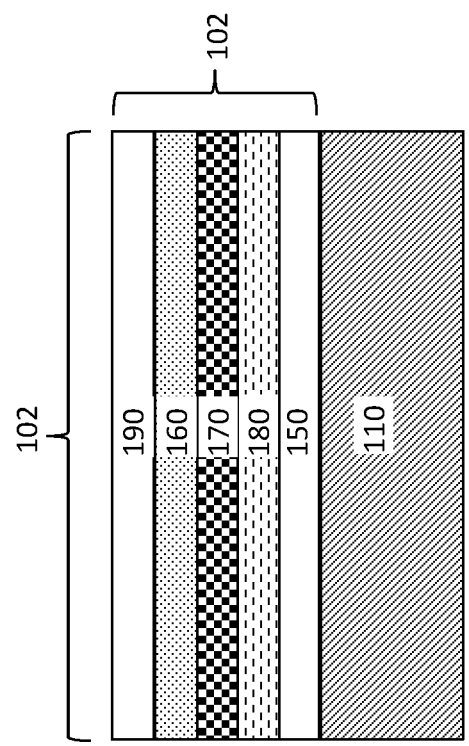
Figure 2A:
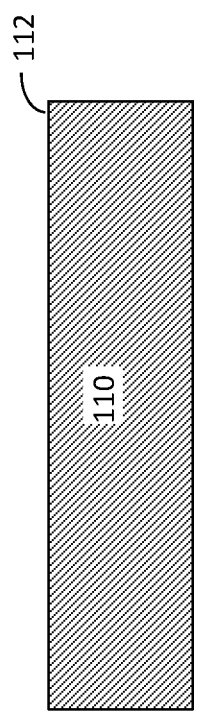

FIGS. 2A-2F illustrate a second embodiment of a sensor last electronic device. In contrast to the sensor first structure of FIGS. 1A-1D where the photosensitive layer 130 is disposed over the substrate 110 before the electrochromic stack 102, the photosensitive layer 130 is disposed on the electrochromic stack 102, and light 101 passes through the substrate 110. FIG. 2A illustrates a cross-sectional side view of a substrate 110. The substrate 210 has a surface 112. The substrate 110 includes a transparent material, for example, quartz.

FIG. 2B illustrates a cross-sectional side view of an electrochromic stack 102 formed on the first surface 112 of the substrate 110. The electrochromic stack 102 includes a first transparent electrode layer 150, an anodic electrochromic layer 180, a solid electrolyte layer 170, a cathodic electrochromic layer 160, and a second transparent electrode layer 190. The first transparent electrode layer 150 is formed on the substrate 110, the anodic electrochromic layer 180 is formed on the first electrode layer 180, the solid electrolyte layer 170 is formed on the anodic electrochromic layer 180, the cathodic electrochromic layer 160 is formed on the solid electrolyte layer 170, and the second transparent electrode is formed on the cathodic electrochromic layer 160.

Figure 2D:
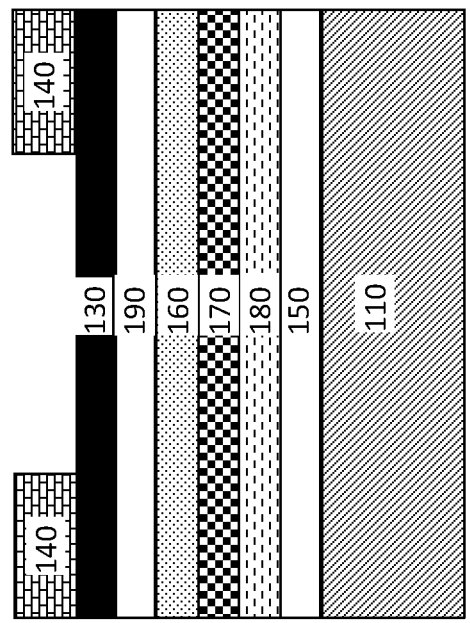
Figure 2C:
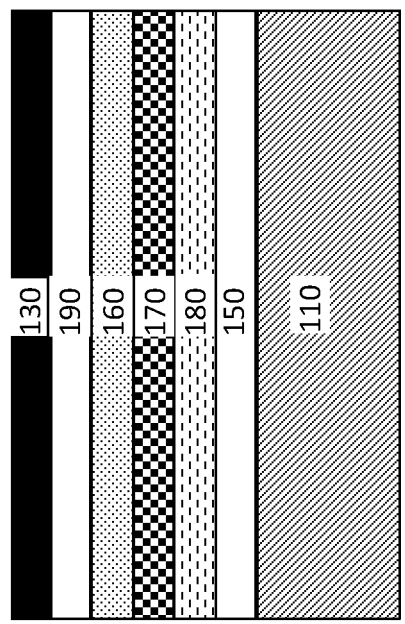

FIG. 2C illustrates a cross-sectional side view of a photosensitive layer 130 formed over the electrochromic stack 102. The photosensitive layer 130 includes a photoresistor or a photodiode.

FIG. 2D illustrates a cross-sectional side view of a pair of electrodes 140 (source and drain) formed over the electrochromic stack 102.

Figure 2F:
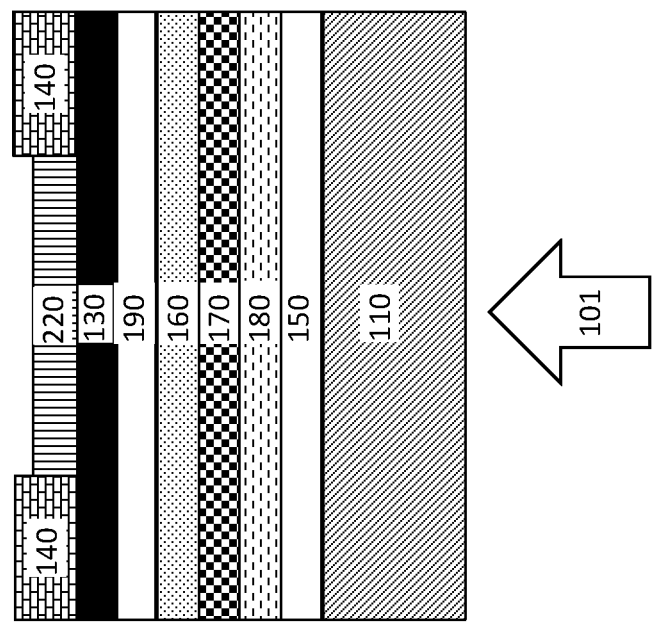
Figure 2E:
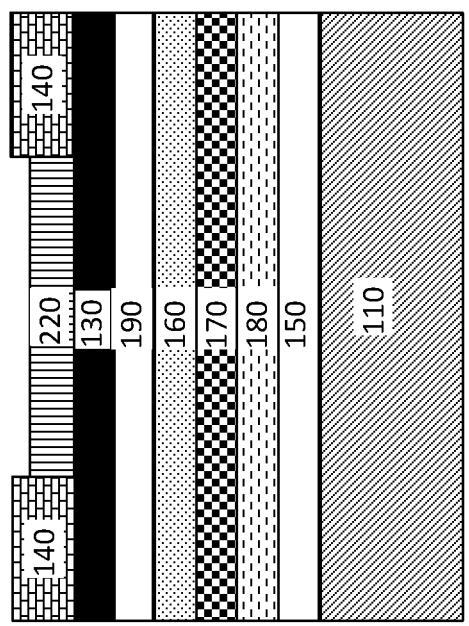

FIG. 2E illustrates a cross-sectional side view of an optional passivation layer 220 formed on the photosensitive layer 130. The passivation layer 220 can be any protective material, which depends on the composition of the photosensitive layer 130. Non-limiting examples of suitable materials for the passivation layer include oxides, e.g., silicon dioxide, titanium dioxide, and nitrides, e.g., silicon nitride, or any combination thereof. Other suitable methods for forming a passivation layer 130 include alclading, chromate conversion coating, anodizing, rouging, or any combination thereof. The passivation layer 220 has a thickness in a range from about 5 nm to about 100 µm. In another aspect, the thickness of the passivation layer 220 is in a range from about 20 nm to about 1 µm. Yet, in another aspect, the thickness of the passivation layer 220 is about or in any range from about 5 nm, 50 nm, 100 nm, 500 nm, 1 µm, 25 µm, 50 µm, and 100 µm.

FIG. 2F illustrates a cross-sectional side view of light 101 activation of the device in the sensor last device FIG. 2E. The electrochromic stack 102 serves as a visible light filter. When a voltage is applied, and the under exposure to visible light 101, the cathodic electrochromic layer 160 and the anodic electrochromic layer 180 in the electrochromic stack 102 switch between bleached (colorless) states and colored states, as described above for FIG. 1D.

FIG. 3A illustrates a schematic diagram for operating a synaptic electronic device 301. The sensor first structure described in FIGS. 1A-1D or the sensor last structure described in FIGS. 2A-2F can be used as the synaptic electronic device 301. The synaptic electronic device 301 includes an electrochromic stack 310 between a pair of electrodes 140 and a photoresistor 340 as the photosensitive layer. A combination of a first voltage pulse 330 from a pre-synaptic neuron 320 and a second voltage pulse 332 from a post-synaptic neuron 322 determines the amount of visible light 101 transmitted through the device 301 (transmitted light 102). The difference between the first voltage pulse 330 and the second voltage pulse 332 provides a larger bias, which results in a larger difference in transmittance between the bleached and colored states in the electrochromic stack 102. The photoresistor 340 changes its resistance based on the amount of transmitted light 102. A third voltage pulse 332 is used to read the resistance of photoresistor 340.

Applying different biases can be used to control the amount of light 101 passing through the device 101. After removing the bias, the resistance remains substantially the same. Therefore, a continuous bias is not needed in the synaptic electronic device 301.

FIG. 3B illustrates a schematic diagram for operating a synaptic electronic device 302 with an electrochromic stack 310 between a pair of electrodes 140 and a photodiode 342 as the photosensitive layer. The sensor first structure described in FIGS. 1A-1D or the sensor last structure described in FIGS. 2A-2F can be used as the synaptic electronic device 302. The synaptic electronic device 302 includes an electrochromic stack 310 between a pair of electrodes 140 and a photodiode 342 as the photosensitive layer. A combination of a first voltage pulse 330 from a pre-synaptic neuron 320 and a second voltage pulse 332 from a post-synaptic neuron 322 determines the amount of visible light 101 transmitted through the device 302 (transmitted light 102). The difference between the first voltage pulse 330 and the second voltage pulse 332 provides a larger bias, which results in a larger difference in transmittance between the bleached and colored states in the electrochromic stack 102. When the photodiode 342 absorbs the transmitted light 102, it produces a current. A third voltage pulse 332 is used to turn on the selecting transistor in order to read the current signal from the photodiode 342.

Applying different biases can be used to control the amount of light 101 passing through the device 101. After removing the bias, the resistance remains substantially the same. Therefore, a continuous bias is not needed in the synaptic electronic device 302. The pair of electrodes 140 are analogous to the axons and dendrites of synapses in a neurosystem.

The above described devices are analogous to synaptic junctions. The connection strength between two neurons is determined by the weight of the synapse connecting them. The higher weight means the stronger connection. In the present invention, the weight is recorded into the transmittance of electrochromic stack 310, which determines the resistance of photoresistor 340 or current generated by photodiode 342.

The above disclosed devices and methods provide various advantages. The devices and methods enable decoupled training and reading elements, which substantially eliminates interference. The devices do not need a selector, and an ultralow programming current can be used (e.g., sub-pico-ampere (pA), compared to micro-amperes (μA) in PCM and RRAM devices).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A synaptic electronic device, comprising:
   a substrate comprising silicon;
   an electrochromic stack disposed on a surface of the substrate, the electrochromic stack comprises a first transparent electrode layer, a cathodic electrochromic layer, a solid electrolyte layer comprising zirconium oxide, an anodic electrochromic layer, and a second transparent electrode layer;
   a photosensitive layer disposed on the electrochromic stack; and
   a pair of electrodes disposed on and at opposing ends of the photosensitive layer.

2. The synaptic electronic device of claim 1, further comprising a passivation layer on the photosensitive layer.

3. The synaptic electronic device of claim 2, wherein the passivation layer is arranged between electrodes of the pair of electrodes.

4. The synaptic electronic device of claim 1, wherein the first transparent electrode layer comprises indium tin oxide.

5. The synaptic electronic device of claim 1, wherein the second transparent electrode layer comprises indium tin oxide.

6. The synaptic electronic device of claim 1, wherein the first transparent electrode layer comprises graphene.

7. The synaptic electronic device of claim 1, wherein the second transparent electrode layer comprises graphene.

8. The synaptic electronic device of claim 1, wherein the anodic electrochromic layer comprises nickel oxide.

9. The synaptic electronic device of claim 1, wherein synaptic electronic device is activated by light.

10. The synaptic electronic device of claim 1, wherein the anodic electrochromic layer is an ion storage layer.

11. The synaptic electronic device of claim 1, wherein the photosensitive material is silicon, germanium, cadmium sulfide, cadmium selenide, lead sulfide, indium antimonide, indium gallium arsenide, mercury cadmium telluride, or any combination thereof.

12. The synaptic electronic device of claim 1, wherein cathodic electrochromic layer comprises tungsten oxide.

13. The synaptic electronic device of claim 1, wherein the substrate comprises glass.

14. The synaptic electronic device of claim 1, wherein the substrate comprises a layer of silicon oxide on the surface of the substrate.

15. The synaptic electronic device of claim 1, wherein the cathodic electrochromic layer comprises tungsten oxide, and the anodic electrochromic layer comprises nickel oxide.

16. The synaptic electronic device of claim 1, wherein the pair of electrodes comprise molybdenum, titanium, indium tin oxide, indium zinc oxide, aluminum, gold, silver, palladium, silicon, boron, phosphorus, arsenic, gallium, or any combination thereof.

17. A synaptic electronic device, comprising:
   a substrate comprising one or more of a semiconductor and an insulator;
   an electrochromic stack disposed on a surface of the substrate, the electrochromic stack comprises a first transparent electrode layer, a cathodic electrochromic layer, a solid electrolyte layer, an anodic electrochromic layer, and a second transparent electrode layer;
   a photosensitive layer disposed on the electrochromic stack; and a pair of electrodes disposed on and at opposing ends of the photosensitive layer;

wherein the photosensitive layer is a photoresistor.

18. A synaptic electronic device, comprising:

a substrate comprising one or more of a semiconductor and an insulator;

an electrochromic stack disposed on a surface of the substrate, the electrochromic stack comprises a first transparent electrode layer, a cathodic electrochromic layer, a solid electrolyte layer, an anodic electrochromic layer, and a second transparent electrode layer;

a photosensitive layer disposed on the electrochromic stack; and a pair of electrodes disposed on and at opposing ends of the photosensitive layer;

wherein the photosensitive layer is a photodiode.

* * * * *